(12) United States Patent
Chen

(10) Patent No.: US 7,564,278 B2
(45) Date of Patent: Jul. 21, 2009

(54) POWER-ON RESET CIRCUIT

(75) Inventor: Kuan-Yeu Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/030,497

(22) Filed: Feb. 13, 2008

(65) Prior Publication Data

US 2008/0150593 A1 Jun. 26, 2008

Related U.S. Application Data

(63) Continuation of application No. 10/925,359, filed on Aug. 24, 2004, now Pat. No. 7,348,814.

(51) Int. Cl.
*H03L 7/00* (2006.01)
(52) U.S. Cl. .................. 327/142; 327/143; 365/185.18
(58) Field of Classification Search ........................ None
See application file for complete search history.

(56) References Cited

U.S. PATENT DOCUMENTS

| | | | |
|---|---|---|---|
| 4,970,408 A | 11/1990 | Hanke et al. | |
| 5,302,861 A | 4/1994 | Jelinek | |
| 5,469,099 A | 11/1995 | Konishi et al. | |
| 5,936,444 A | 8/1999 | Pathak et al. | |
| 6,005,423 A | 12/1999 | Schultz | |
| 6,052,006 A | 4/2000 | Talaga, Jr. et al. | |
| 6,104,221 A | 8/2000 | Hoon et al. | |
| 6,157,227 A | 12/2000 | Giovinazzi et al. | |
| 6,239,630 B1 * | 5/2001 | Bowers et al. | 327/143 |
| 6,358,824 B1 * | 3/2002 | Gossmann et al. | 438/525 |
| 6,566,928 B1 * | 5/2003 | Miyagi | 327/217 |
| 6,573,543 B2 * | 6/2003 | Takata | 257/295 |
| 6,972,602 B2 * | 12/2005 | Akamatsu et al. | 327/143 |
| 7,019,417 B2 * | 3/2006 | Kang | 307/113 |
| 7,193,253 B2 | 3/2007 | Doczy et al. | |

* cited by examiner

*Primary Examiner*—Tuan Lam
*Assistant Examiner*—Hiep Nguyen
(74) *Attorney, Agent, or Firm*—Kenta Suzue; Haynes Beffel & Wolfeld LLP

(57) ABSTRACT

A circuit and a method generate a power-on reset signal having a leading part and a trailing part. The circuit includes a startup circuit generating the leading part of the power-on reset signal and a second circuit generating the trailing part of the power-on reset signal. The power-on reset circuit is implemented by a process which does not rely on native devices having zero threshold voltage to control a circuit generating the trailing part of the power-on reset signal.

10 Claims, 3 Drawing Sheets

POWER-ON RESET CIRCUIT

RELATED APPLICATIONS

This application is a continuation of U.S. application Ser. No. 10/925,359, filed 24 Aug. 2004 (MXIC 1570-1) by inventor Kuan-Yeu Chen entitled Power-On Reset Circuit. This application is incorporated herein by reference.

BACKGROUND OF THE INVENTION

1. Field of the Invention

The present invention relates to power-on reset circuits generating a power-on reset pulse signal.

2. Description of Related Art

The mission function of an integrated circuit may be performed erratically without a reliable power-on reset circuit. Power-on reset circuits provide a delay in time from the initial voltage rise of the main voltage supply until the main voltage supply has risen sufficiently to predictably supply power to an integrated circuit or a portion of the integrated circuit. Commonly, the output of the power-on reset circuit is connected to an enable input of the circuitry performing the mission function of the circuit.

The power-on reset circuit of U.S. Pat. No. 5,936,444, relies on transistors having a zero threshold voltage. However, transistors having a zero threshold voltage add steps to the CMOS manufacturing process and thereby raise the cost substantially.

A need therefore exists for a power-on reset circuit which is not critically dependent on zero threshold voltage transistors to function.

SUMMARY OF THE INVENTION

The present invention provides a circuit and a method for generating a power-on reset signal having a leading part and a trailing part.

In one aspect of the present invention, a circuit includes a voltage supply, a ground, an output node having an output voltage and outputting the power-on reset signal, a startup circuit, and a signal source circuit having an input and an output. The startup circuit is adapted to initialize any node voltages of the circuit that determine the output voltage of the output node, and adapted to generate the leading part of the power-on reset signal. An example of a startup circuit is a voltage detector. The signal source circuit is adapted to generate the trailing part of the power-on reset signal when an input voltage at the input of the signal source circuit exceeds a trip point voltage of the signal source circuit. An example of a signal source circuit is a voltage detector. All threshold voltages of all transistors of the circuit generating the power-on reset signal have nonzero threshold voltages adjusted by ion implantation.

In some embodiments, the startup circuit includes a voltage detector, a transistor, and a capacitor coupled to the voltage supply and the ground. The voltage detector of the startup circuit is coupled to the voltage supply and the ground. The voltage detector of the startup circuit has an input coupled to the capacitor, and an output. The transistor is coupled to the ground and the output of the voltage detector, and decouples the startup circuit from the power-on reset signal, for example prior to when the signal source circuit generates a trailing part of the power-on reset signal. Such decoupling is useful after the startup circuit has generated a leading part of the power-on reset signal, and the signal source is generating a trailing part of the power-on reset signal. In this situation, the startup circuit and the signal source are generating conflicting signals for the power-on reset signal.

In another embodiment where the startup circuit includes a voltage detector, a transistor, and a capacitor, the output of the voltage detector of the startup circuit generates the leading part of the power-on reset signal by coupling the voltage supply to a gate of the first transistor.

In another embodiment where the startup circuit includes a voltage detector, a transistor, and a capacitor, in response to a continuing voltage rise of the voltage supply, a voltage of the capacitor exceeds a trip point of the voltage detector, the voltage detector couples the ground to a gate of the first transistor, and the first transistor decouples the startup circuit from the power-on reset signal.

In another embodiment, the voltage detector of the signal source circuit generates the trailing part of the power-on reset signal, for example when the input voltage at the input of the signal source circuit exceeds the trip point voltage of the signal source circuit.

Some embodiments include a feedback transistor. The feedback transistor has a first current-carrying terminal coupled to the voltage supply, a second current-carrying terminal coupled to a voltage detector of the signal source circuit, and a gate coupled to the output of the signal source circuit. After the signal source circuit generates the trailing part of the power-on reset signal, the feedback circuit decouples the voltage supply from the signal source circuit, conserving power after both leading and trailing parts of the power-on reset signal have been generated. Thus, in response to said generating the trailing part of the power-on reset signal, the voltage supply is decoupled from the signal source circuit generating the trailing part of the power-on reset signal.

In various embodiments, a voltage rise of the voltage supply causes one or more various responses. In one response, the voltage at the input of the signal source circuit is set below the trip point voltage of the signal source circuit, for example by coupling the input of the signal source circuit to the ground. In another response, the signal source circuit generates a signal consistent with the leading part of the power-on reset signal. Such consistency is relevant prior to when the signal source circuit generates the trailing part of the power-on reset signal. Prior to the continuing rise of the voltage supply, the signal source circuit has not yet generated the trailing part of the power-on reset signal. Thus, prior to the continuing rise of the voltage supply, if the signal source circuit generates a signal consistent with the leading part of the power-on reset signal, then the output of the signal source circuit need not be decoupled from the power-on reset signal.

In various embodiments, after the voltage rise of the voltage supply, a continuing voltage rise of the voltage supply causes a response, such as raising a voltage at an input of the signal source circuit above the trip point voltage of the signal source circuit, for example by coupling the input of the inverter to voltage supply.

In one aspect of the present invention, a method is provided for generating a power-on reset signal having a leading part and a trailing part. In response to a voltage rise of a voltage supply, one or more node voltages of the circuit are initialized, and the leading part of the power-on reset signal is generated. The nodes that are initialized determine the output voltage of the output node. The input voltage of a signal source circuit is set via at least a first transistor having a nonzero threshold voltage adjusted by ion implantation. In response to a continuing voltage rise of the voltage supply, the input voltage of the signal source circuit is raised past a trip point voltage of the signal source circuit. The trailing part of the power-on reset signal is generated from the signal source.

In one embodiment, generating the leading part of the power-on reset signal includes multiple steps. An inverter output is coupled to the voltage supply, bringing the output voltage of the inverter output to the voltage of the supply voltage. The voltage supply is coupled via the inverter to a gate of a transistor coupled to the ground, turning on the transistor. An input of a second inverter is coupled to the ground via the transistor coupled to the ground, bringing the voltage at the input of the second inverter below the trip point of the inverter.

In one embodiment, the input voltage of the signal source is via at least a second transistor having a nonzero threshold voltage adjusted by ion implantation. The first and second transistors are coupled to different voltages, such as a voltage supply and ground. Circuit elements such as transistors and resistors couple the first and second transistors to the different voltages, permitting both different voltages to be coupled to the input voltage of the signal source at the same time.

In one embodiment, the signal source generates a signal consistent with the leading part of the power-on reset signal. Prior to the continuing rise of the voltage supply, the signal source has not yet generated the trailing part of the power-on reset signal. Thus, prior to the continuing rise of the voltage supply, if the signal source generates a signal consistent with the leading part of the power-on reset signal, then the output of the signal source need not be decoupled from the power-on reset signal.

Another benefit of many embodiments is that the power consumption of the power-on reset circuit before and after generating the power-on reset signal is negligible.

DETAILED DESCRIPTION

Figure 1:
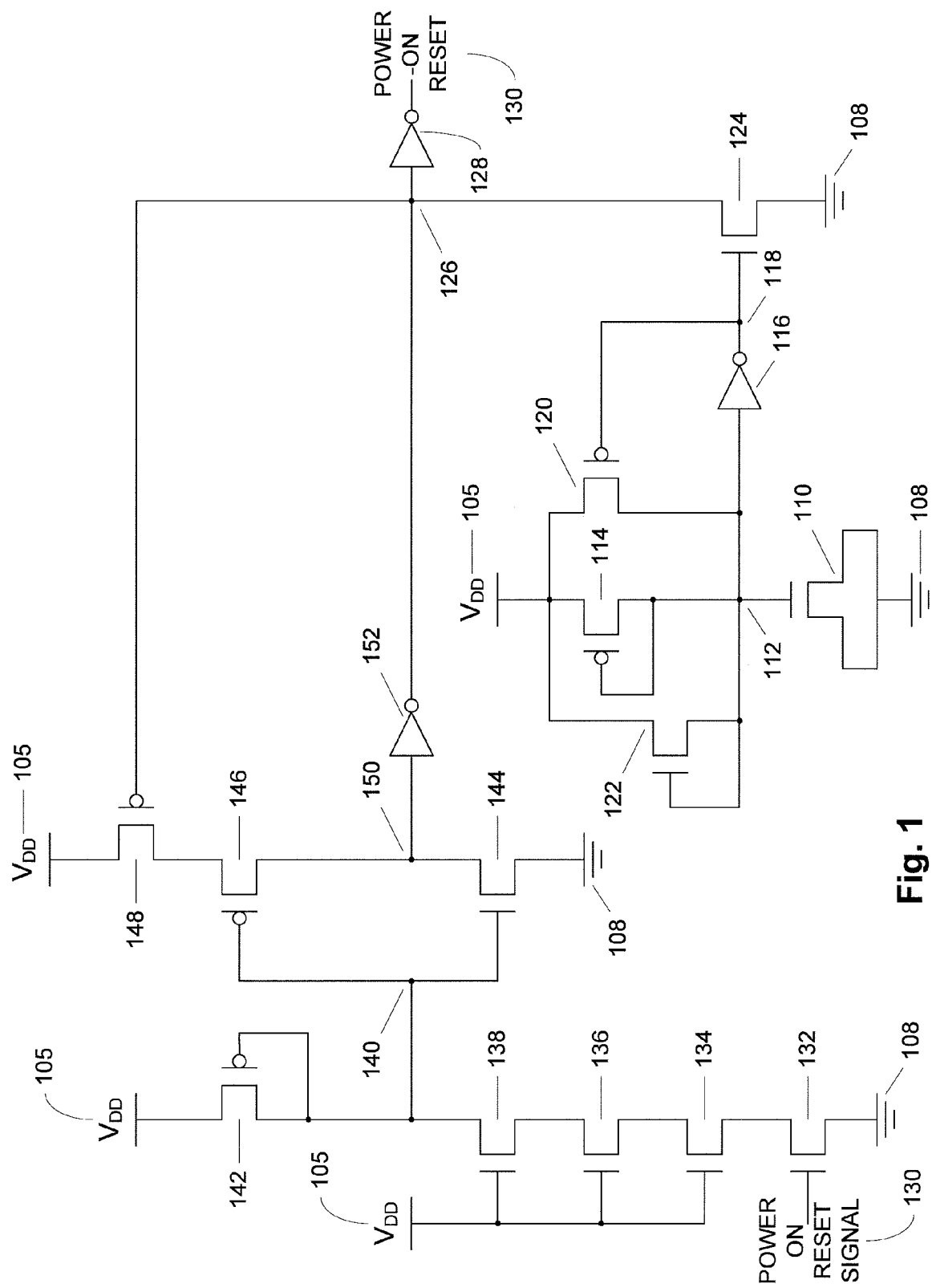
FIG. 1 shows a circuit diagram of a power-on reset circuit.

FIG. 1 shows a circuit diagram of a power-on reset circuit. The power-on reset circuit includes a startup circuit generating a leading part of a power-on reset signal and a signal source circuit generating a trailing part of the power-on reset signal. The startup circuit includes n-type transistors 110, 122, and 124; p-type transistors 114 and 120; and inverter 116. The signal source circuit includes n-type transistors 132, 134, 136, 138, and 144; and p-type transistors 142, 146, and 148.

The startup circuit is connected as follows. Transistor 110 has a gate connected to node 112 and both current-carrying terminals connected to ground 108. Transistors 114, 122, and 120 have one current-carrying terminal connected to node 112 and another current-carrying terminal connected to voltage supply 105. The gate of transistor 122 and the gate of transistor 114 are connected to node 112. The gate of transistor 120 is connected to node 118. Inverter 116 has an input connected to node 112 and an output connected to node 118. The inverter 116 serves as a voltage detector that generates the leading part of the power-on reset signal in response to a voltage rise of the voltage supply. Transistor 124 has one current-carrying terminal connected to ground 108, another current-carrying terminal connected to node 126, and a gate connected to node 118.

Inverter 152 has an input connected to node 150 and an output connected to node 126. Inverter 128 has an input connected to node 126 an output generating the power-on reset signal 130. The output of inverter 128 is connected to the output node of the power-on reset circuit. Because the voltage of node 126 determines the value of the power-on reset signal, node 126 is a node determining the output voltage of the output node. The power-on reset signal 130 is an input to the signal source circuit generating the trailing part of the power-on reset signal.

The signal source circuit is connected as follows. Transistor 132 has a gate connected to the power-on reset signal 130, one current-carrying terminal connected to the ground 108, and another current-carrying terminal connected to a current-carrying terminal of transistor 134. Transistors 134, 136, and 138 have a gate connected to voltage supply 105 and current-carrying terminals connected in series between node 140 and a current-carrying terminal of transistor 132. Transistor 142 has a gate connected to node 140, one current-carrying terminal connected to node 140, and another current-carrying terminal connected to voltage supply 105. Inverter connected transistors 144 and 146, which act as a voltage detector for the trailing part of the power-on signal, have an input connected to node 140 and an output connected to node 150. One of the current-carrying terminals of transistor 144 is connected to ground 108. One of the current-carrying terminals of transistor 146 is connected to a current-carrying terminal of transistor 148. Transistor 148 has a gate connected to node 126, one current-carrying terminal connected to a current-carrying terminal of transistor 146, and another current-carrying terminal connected to voltage supply 105.

Figure 2:
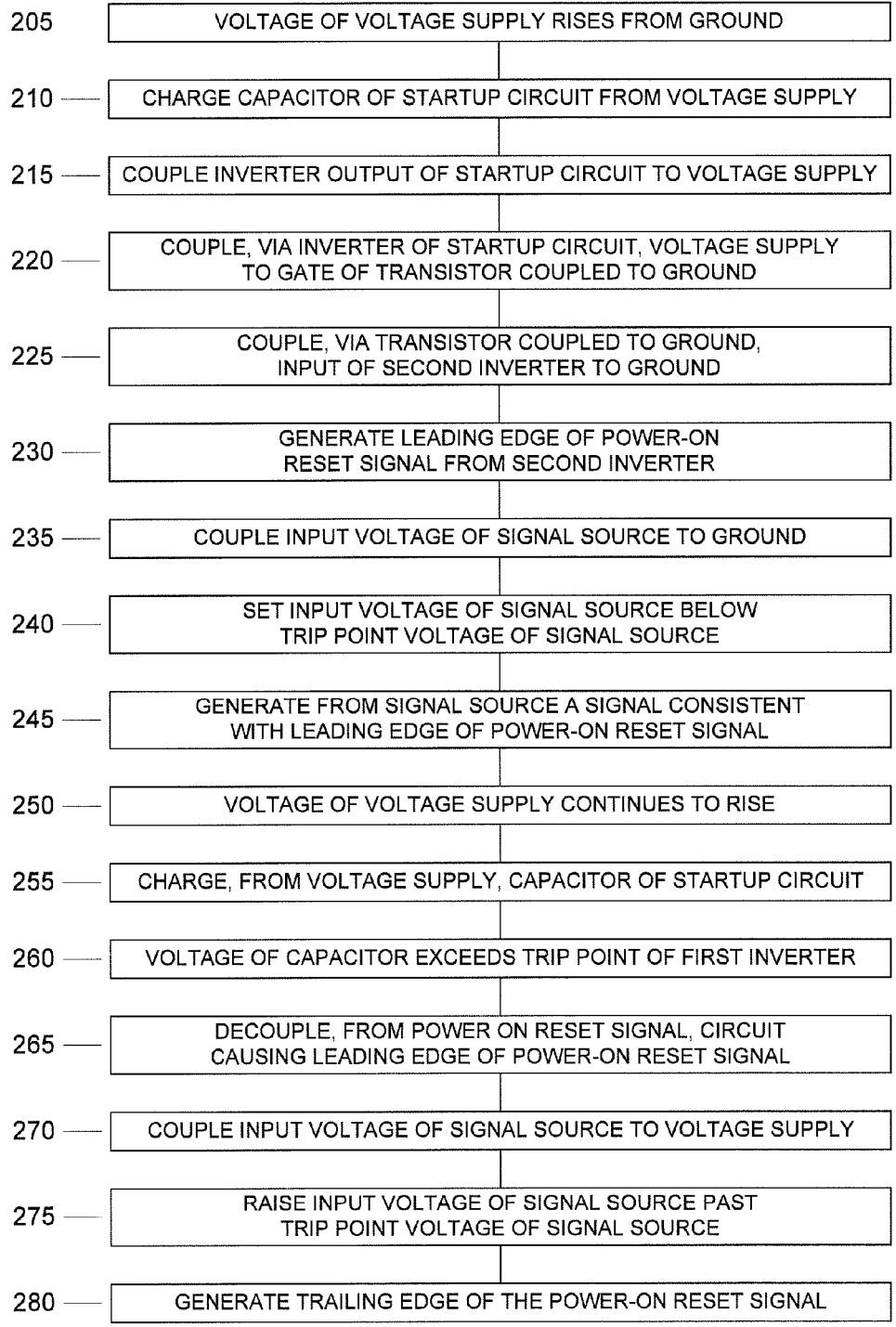
FIG. 2 shows a process flow of generating the leading and trailing parts of a power-on reset signal.

FIG. 2 shows a process flow of generating the leading and trailing parts of a power-on reset signal. In 205, the voltage of the voltage supply 105 rises from the ground voltage. This voltage rise causes the leading part of the power-on reset signal 130 to be generated, as follows. In 210, a capacitor of the startup circuit generating the leading part of the power-on reset signal is charged from voltage supply 105. In this example, the capacitor is a capacitor connected transistor such as transistor 110. The voltage of the charging capacitor determines the voltage at node 112 which also determines the input voltage of inverter 116. Initially, the voltage of the charging capacitor is sufficiently low so as to be below the trip point of the inverter 116. The output voltage of the inverter 116 at node 118 is therefore coupled to the rising voltage supply 105, and follows the rising voltage supply 105. Consequently, in 215, via inverter 116, the voltage supply 105 is coupled to the gate of transistor 124. When the voltage supply 105 rises past the threshold voltage of transistor 124, transistor 124 turns on, and couples ground 108 to node 126, which is the input of inverter 128. Thus in 220, the gate of transistor 124 is coupled to the ground 108. Then, in 225, via transistor 124, the input of inverter 128 is coupled to ground 108. Because the output of inverter 128 is the power-on reset signal, coupling the input of inverter 128 to ground 108 initializes the node of the circuit determining the output voltage of the output node. Consequently, the output of inverter 128 is coupled to voltage supply 105. In 230, the leading part of the power-on reset signal 130 is present at the output node of the power-on reset circuit.

The power-on reset signal 130 is received by the gate of transistor 132 and turns on transistor 132. Series connected transistors 134, 136, and 138 act as resistors. Node 140 is coupled to ground 108 through transistors 132, 134, 136, and 138. Node 140 is connected to the gates of transistors 144 and 146. Transistors 144 and 146, which act as a voltage detector for the trailing part of the power-on reset signal, are coupled to ground 108. Hence, in 235, the input of the signal source circuit of the trailing part of the power-on reset signal is coupled to ground 108. In 240, the voltage at node 140 at this point is below the trip point voltage of the signal source circuit of the trailing part of the power-on reset signal. Because the voltage at node 140 at this point is below this trip point voltage, the voltage of node 150 follows the voltage supply 105 through transistor 148, which is turned on by the low voltage (coupled to ground 108) of node 126. Inverter 152 takes as input the high voltage of node 150 and sends as output the voltage of ground 108. Thus, the output of inverter 152 is consistent with the signal from transistor 124 and is consistent with the leading part of the power-on reset signal.

In 250, the voltage of voltage supply 105 continues to rise. In 255, the voltage of node 112 continues to rise as the capacitor connected transistor 110 continues to charge. In 260, the voltage of node 112 exceeds the trip point of the inverter 116. The output voltage of the inverter 116 at node 118 falls low after being coupled to ground 108. This places the voltage on the gate of transistor 124 below the threshold voltage of transistor 124, and turns off transistor 124. Consequently, in 265 the circuit generating the leading part of the power-on reset signal is decoupled from the power-on reset signal 130.

When the voltage of voltage supply 105 continues to rise, transistor 142 turns on, and node 140 becomes coupled to voltage supply 105 through transistor 142. Node 140 is connected to the gates of transistors 144 and 146. Transistors 144 and 146, which act as a voltage detector for the trailing part of the power-on reset signal, are coupled to ground 108. Hence, in 270, the input of the signal source circuit of the trailing part of the power-on reset signal is coupled to voltage supply 105. When the voltage of the voltage supply 105 rises sufficiently, in 275 the input voltage of the signal source circuit for the trailing part of the power-on reset signal is raised past the trip point of the signal source circuit. The output voltage of the signal source at node 150 is coupled to ground 108 and falls low. Inverter 152 receives as input the low voltage at node 150 and sends as output the high voltage of voltage supply 105 to node 126. Inverter 128 receives as input the high voltage at node 126 and sends as output the low voltage of ground 108. This low voltage output from the inverter 128 is the trailing part of the power-on reset signal. Consequently, in 280 the trailing part of the power-on reset signal is present at the output node of the power-on reset circuit.

Figure 3:
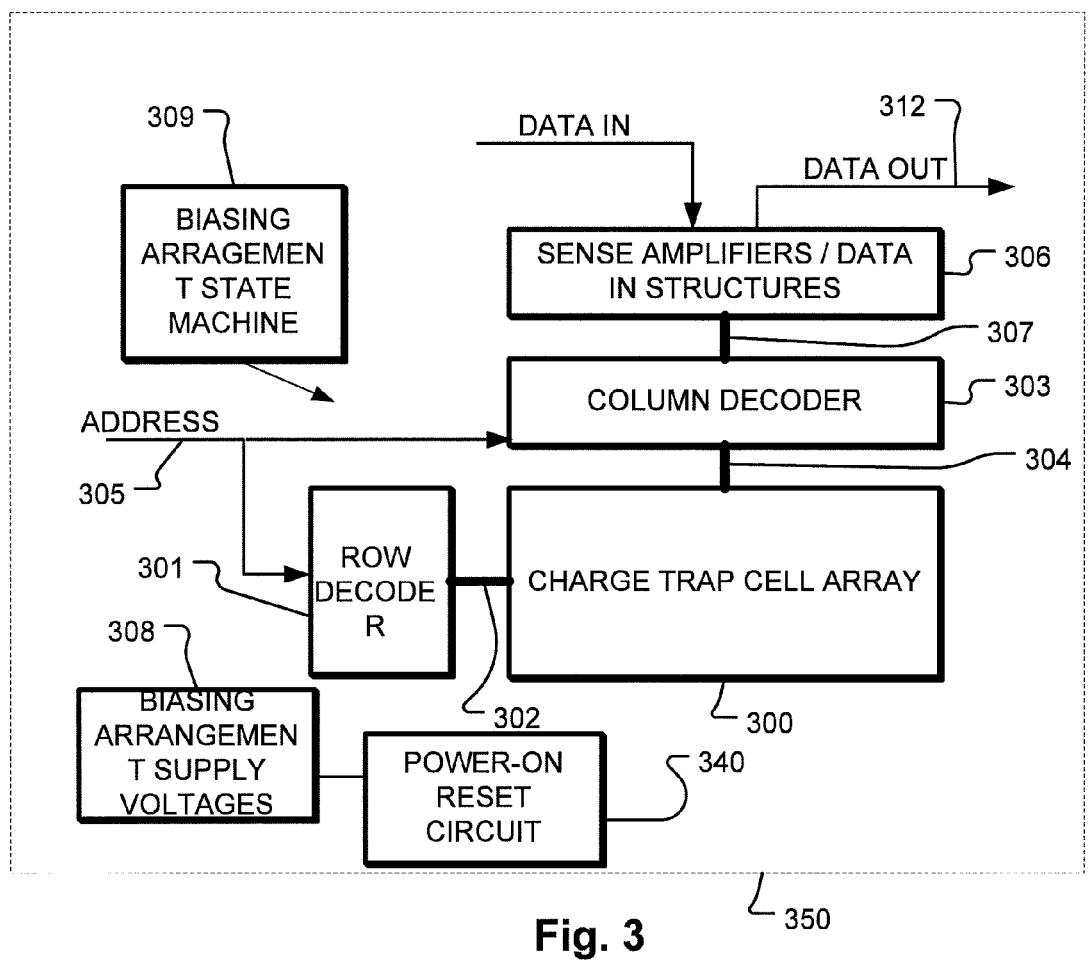
FIG. 3 shows an integrated circuit with a power-on reset circuit.

FIG. 3 is a simplified block diagram of an integrated circuit according to an embodiment of the present invention. The integrated circuit 350 includes a memory array 300 implemented using localized charge trapping memory cells, on a semiconductor substrate. The supply voltages 308 and power-on reset circuit 340 supply power to the integrated circuit 350. A row decoder 301 is coupled to a plurality of wordlines 302 arranged along rows in the memory array 300. A column decoder 303 is coupled to a plurality of bitlines 304 arranged along columns in the memory array 300. Addresses are supplied on bus 305 to column decoder 303 and row decoder 301. Sense amplifiers and data-in structures in block 306 are coupled to the column decoder 303 via data bus 307. Data is supplied via the data-in line 311 from input/output ports on the integrated circuit 350, or from other data sources internal or external to the integrated circuit 350, to the data-in structures in block 306. Data is supplied via the data out line 312 from the sense amplifiers in block 306 to input/output ports on the integrated circuit 350, or to other data destinations internal or external to the integrated circuit 350.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A power on reset circuit comprising:
    a first inverter having an input node and an output node, the output node of the first inverter generating a power-on reset signal;
    a startup circuit generating a leading part of the power-on reset signal, the startup circuit comprising a transistor having a first current-carrying terminal coupled to a ground and a second current-carrying terminal connected to the input node of the first inverter, the startup circuit including:
        a second inverter coupled to a gate terminal of the transistor of the startup circuit; and
        a capacitor coupled to the second inverter; and
    a signal source circuit coupled to the input node of the first inverter, the signal source circuit generating a trailing part of the power-on reset signal.

2. The power on reset circuit of claim 1, wherein the second current-carrying terminal of the transistor of the startup circuit is a drain terminal.

3. The power on reset circuit of claim 1, wherein all threshold voltages of all transistors generating the power-on reset signal are adjusted by ion implantation to be nonzero.

4. The power on reset circuit of claim 1, wherein the signal source circuit includes:
    a voltage detector generating the trailing part of the power-on reset signal.

5. The power on reset circuit of claim 1, further comprising:
    a feedback transistor having a current-carrying terminal coupled to a voltage detector of the signal source circuit, and a gate coupled to an output of the signal source circuit.

6. A power on reset circuit comprising:
    a first inverter having an input node and an output node, the output node of the first inverter generating a power-on reset signal;
    a startup circuit generating a leading part of the power-on reset signal, the startup circuit comprising a transistor having a first current-carrying terminal coupled to a ground and a second current-carrying terminal connected to the input node of the first inverter;
    a signal source circuit coupled to the input node of the first inverter, the signal source circuit generating a trailing part of the power-on reset signal, the signal source circuit including a voltage detector and an output; and
    a feedback transistor having a current-carrying terminal coupled to the voltage detector of the signal source circuit, and a gate coupled to the output of the signal source circuit.

7. The power on reset circuit of claim 6, wherein the second current-carrying terminal of the transistor of the startup circuit is a drain terminal.

8. The power on reset circuit of claim 6, wherein all threshold voltages of all transistors generating the power-on reset signal are adjusted by ion implantation to be nonzero.

9. The power on reset circuit of claim 6, wherein the startup circuit includes:
    a second inverter coupled to a gate terminal of the transistor of the startup circuit; and
    a capacitor coupled to the second inverter.

10. The power on reset circuit of claim 6, wherein the signal source circuit includes:
    a voltage detector generating the trailing part of the power-on reset signal.

* * * * *